United States Patent [19]

Welkowsky et al.

[11] Patent Number: 5,160,560
[45] Date of Patent: Nov. 3, 1992

[54] METHOD OF PRODUCING OPTICALLY FLAT SURFACES ON PROCESSED SILICON WAFERS

[75] Inventors: Murray S. Welkowsky, Chatsworth; P. K. Vasudev, Thousand Oaks; Philip G. Reif, Chatsworth; Norman W. Goodwin, Encino, all of Calif.

[73] Assignee: Hughes Aircraft Company, Los Angeles, Calif.

[21] Appl. No.: 201,809

[22] Filed: Jun. 2, 1988

[51] Int. Cl.⁵ ............................................. B32B 31/16
[52] U.S. Cl. ............................... 156/154; 51/216 LP; 51/283 R; 148/DIG. 12; 148/DIG. 135; 156/272.2; 156/273.1; 156/273.9
[58] Field of Search ............... 156/273.1, 273.9, 272.2, 156/153, 154, 155, 230, 241, 299; 437/171, 225; 51/216 LP, 283 R; 148/DIG. 135, DIG. 12

[56] References Cited

U.S. PATENT DOCUMENTS

| | | | |
|---|---|---|---|
| 3,123,953 | 3/1964 | Merkl | 29/25.35 X |
| 3,506,424 | 4/1970 | Pomerantz | 156/273.9 X |
| 3,808,079 | 4/1974 | Akashi et al. | 156/214 |
| 3,824,002 | 7/1974 | Beard | 350/342 |
| 3,841,031 | 10/1974 | Walsh | 51/283 |
| 3,847,697 | 11/1974 | Baker et al. | 156/155 |
| 3,951,707 | 4/1976 | Kurtz et al. | 156/273.1 X |
| 4,132,037 | 1/1979 | Bonora | 51/216 LP X |
| 4,179,324 | 12/1979 | Kirkpatrick | 156/273.1 X |
| 4,239,567 | 12/1980 | Winings | 156/154 |
| 4,285,714 | 8/1981 | Kirkpatrick | |
| 4,294,602 | 10/1981 | Horne | 65/40 |
| 4,316,757 | 2/1982 | Walsh | 156/154 X |
| 4,384,899 | 5/1983 | Myers | 148/1.5 |
| 4,415,948 | 11/1983 | Grantham et al. | 361/283 |
| 4,470,856 | 9/1984 | Little et al. | 156/64 |
| 4,501,060 | 2/1985 | Frye et al. | 156/273.9 X |
| 4,537,827 | 8/1985 | Little et al. | 428/409 |
| 4,586,109 | 4/1986 | Peters et al. | 361/283 |
| 4,632,871 | 12/1986 | Karnezos et al. | 428/336 |
| 4,638,552 | 1/1987 | Shimbo et al. | 156/273.9 X |
| 4,671,846 | 6/1987 | Shimbo et al. | 437/225 X |
| 4,680,243 | 7/1987 | Shimkunas et al. | 430/5 |
| 4,883,215 | 11/1989 | Goesele et al. | 156/281 X |
| 4,898,804 | 2/1990 | Rauschenbach et al. | 437/180 X |
| 5,028,558 | 7/1991 | Haisma et al. | 148/DIG. 12 |

OTHER PUBLICATIONS

Bonora, "Flex-Mount Polishing of Silicon Wafers", Oct. 1977, pp. 55-58 and 62.
IEEE Electron Device Letters, vol. EDL-8, No. 4, Apr. 1987, (New York, US), L. J. Spangler et al.: "A Technology for High14 Performance Single-Crystal Silicon-on-Insulator Transistors", pp. 137-139. See pp. 137,138, Section II: Device Fabrication.
P. R. Younger, "Hermetic Glass Sealing by Electrostatic Bonding", Journal of Non-Crystalline Solids, 38 and 39, North-Holland Publishing Company (1980), pp. 904-914.

(List continued on next page.)

Primary Examiner—Michael W. Ball
Assistant Examiner—Michele K. Yoder
Attorney, Agent, or Firm—V. D. Duraiswamy; W. K. Denson-Low

[57] ABSTRACT

A method for producing optically flat thin semiconductor wafers (12) bonded to a substrate (16). The wafer (12) is bonded without touching the top surface of the wafer (12). Also, the bond is created without the use of pressure. Electrostatic bonding, or contact bonding or both may be employed. After the wafer (12) is bonded, it is then polished to a desired thickness and flatness. After contact bonding and polishing the wafer (12) may then be removed for further processing. The wafer may then be contact bonded to a final substrate (b 34) or electrostatically bonded to a final substrate (42). The contact bonding technique may also be employed as a means for holding the wafer (12) during precise photolithography. The optical flatness achieved permits improved yields over conventional means for securing wafers during photolithography. The electrostatic bonding technique permits extremely thin optically flat silicon wafers to be produced.

2 Claims, 3 Drawing Sheets

OTHER PUBLICATIONS

M. B. Pitzer et al., "Development of an Electrostatically Bonded Fiber Optic Connection Technique", IEEE Journal of Quantum Electronics, QE 18, (1982), pp. 1584–1588.

G. Wallis et al., "Field Assisted Glass–Metal Sealing", Journal of Applied Physics, 10 (1969), pp. 3946–3949.

R. C. Frye et al., "A Field-Assisted Bonding Process for Silicon Dielectric Isolation", J. Electrochem. Soc.: Solid-State Science & Technology, 133 (1986), pp. 1673–1677.

J. B. Lasky, "Wafer Bonding for Silicon-On-Insulator Technologies", Appl. Phys. Lett. 48(1), Jan. 6, 1986, pp. 78–80.

METHOD OF PRODUCING OPTICALLY FLAT SURFACES ON PROCESSED SILICON WAFERS

CROSS-REFERENCE TO RELATED APPLICATIONS

The invention described herein has subject matter which is related to the application entitled "Planarization of Fiber Optic Faceplates," by James Hayden, which is assigned to the same assignee as the present invention.

BACKGROUND OF THE INVENTION

1. Field of the Invention

The present invention pertains generally to semiconductor wafers and in particular to a method for producing and bonding optically flat silicon wafers.

2. Description of the Related Art

Semiconductor material such as silicon is used in several types of optical devices. Silicon, whether in wafer or chip form, is utilized most frequently for its electrical properties. In some devices, however, both the electrical and optical properties of the silicon material are important. An example of such a device is a silicon liquid crystal light valve, such as the one described in U.S. Pat. No. 3,824,002 to Terry D. Beard, entitled "Alternating Current Liquid Crystal Light Valve" and assigned to the same assignee as the present invention. Such a device utilizes a very thin silicon wafer, about five mils thick and about two inches in diameter. It is important that a silicon wafer in a liquid crystal light valve have good optical flatness such as one quarter wavelength or better. It has been found that because the wafer is very thin and somewhat flexible and because of the limitations in polishing techniques, the resulting flatness of the wafers has been less than ideal. Specifically, peak-to-valley deviations are typically on the order of five microns on each side. Because the flatness deviations on one side are independent of those on the other side of the wafer, the thickness variations may be as much as ten microns. In a liquid crystal light valve, it is preferred that the surface of the wafer should be flat to within one micron.

One improved method of producing optically flat silicon wafers is described in U.S. Pat. No. 4,470,856 issued to Little et al. and assigned to the same assignee as the present invention. U.S. Pat. No. 4,470,856 teaches a method for hydrostatically flattening a silicon wafer by pressing the silicon wafer with an optical flat onto a flat baseplate and utilizing a fluid adhesive to secure the wafer to the baseplate. While this method does produce a bonded wafer with acceptable optical flatness, it has some drawbacks. When used in a liquid crystal light valve, the silicon wafer may have a dielectric mirror deposited on its top surface. If the mirror is deposited on the wafer before the hydrostatic flattening operation, contact of the optical flat with the mirror can produce defects in the mirror. If the mirror is deposited after the hydrostatic flattening operation, the fluid adhesive generally cannot withstand the high temperatures necessary for subsequent deposition of the mirror. Also, the layer of glue may distort the resulting image in a liquid crystal light valve if it is not completely uniform in thickness.

In addition, if the wafer has been processed in other ways such as gate oxidation, before bonding to a baseplate, the uneven surface on the wafer caused by such processing will cause the wafer to deform when it is pressed by the optical flat. As a result, any means of attaching the processed wafer to a base plate involving the application of non-uniform pressure is likely to cause unacceptable deformities or defects in the wafer. Thus, it would be desirable to provide a method of producing an optically flat silicon wafer and bonding the wafer without an adhesive or the application of non-uniform pressure or contact with the top surface of the wafer.

Applicant has found that certain advantages result when a technique known as electrostatic bonding is used in the production of optically flat silicon wafers. The technique of electrostatic bonding is described, for example, in U.S. Pat. No. 4,680,243 issued to Shimkunas et al. on Jul. 14, 1987 and the article by P. R. Younger, "Hermetic Glass Sealing By Electrostatic Bonding", Journal of Non-Crystalline Solids, 38 and 39, North-Holland Publishing Company, (1980), 904–914. As discussed in the Younger article, electrostatic bonding is a field assisted sealing technique which requires high temperature to produce ionic conductivity within the glass and high voltage to promote ion migration which allows bond formation to take place. While the exact mechanism of the resulting bond is not well understood, it is believed that an ion exchange occurs during the bonding process. Prior uses of electrostatic bonding have been directed to addressing problems other than the optical flatness of the resulting surface. For example, see U.S. Pat. No. 4,294,602, issued to Horne, which describes a method of electrostatically bonding a borosilicate glass to silicon to protect solar cells from damage due to ultraviolet light. See also the article by M. B. Spitzer et al., "Development of an Electrostatically Bonded Fiber Optic Connection Technique", IEEE Journal of Quantum Electronics, QE18, IEEE (1982), 1584–1588, the article by G. Wallis et al., "Field Assisted Glass-Metal Sealing", Journal of Applied Physics, 10 (1969) 3946–3949, and the article by R. C. Frye, et al., "A field-Assisted Bonding Process for Silicon Dielectric Isolation", J. Electrochem. Soc.: Solid-State Science and Technology, 133 (1986) 1673–1677.

In addition to the above examples, optical flatness is a problem with thin semiconductor wafers even where the device produced only utilizes the electrical properties of the wafer and the final optical characteristics are not critical. For example, in producing many semiconductor devices, precise photolithography techniques are required. Currently, such techniques utilize a vacuum chuck to hold the wafer during the photolithography process. However, it is known that vacuum chucks deform the surface of the wafers in the area where the vacuum is pulling on it. Consequently, during precise photolithography where geometries of three microns or under may be achieved, deviations from flatness caused by the vacuum chuck can cause defects in the devices produced. This is because, for example, when using a production system with a low depth of field, photomasks may not make a good contact over the entire surface of the wafer. Thus, in a four-inch wafer containing a large number of individual circuits, a circuit formed in the area where there is a depression in the wafer will likely be defective. As a result, conventional methods of mounting a thin semiconductor wafer during photolithography limits the size of the individual defect-free circuit which can be produced. This limitation is also a barrier to the goal of achieving wafer scale integration on thin wafers.

Thus, it would be desirable to have a method for temporarily securing a thin flexible semiconductor wafer in a manner which maintains optical flatness during precision photolithography. Such a method would also be useful in any process which requires a semiconductor wafer to be optically flat and which also requires the wafer to be removed without damaging it.

SUMMARY OF THE INVENTION

In the present invention, a thin flexible semiconductor wafer is attached to a baseplate in a manner which maintains optical flatness, without the need for applying pressure. The bottom surface of the wafer and the top surface of the baseplate are first cleaned so that they are free of particles. The bottom surface of the wafer is brought into direct intimate contact with the top surface of the baseplate without the application of pressure. Also, the top surface of the wafer is not touched. Finally, the top surface of the wafer can then be ground and polished or processed in a desired manner without deforming or otherwise damaging the wafer.

In one embodiment of the invention, the semiconductor wafer is bonded to a glass substrate using an electrostatic bonding technique. This technique involves the application of heat and voltage to the semiconductor wafer and the glass substrate. The co-efficient of thermal expansion of the glass substrate must be well matched to that of the wafer over a temperature range up to and including the highest processing temperature encountered during wafer processing. The semiconductor wafer used is relatively thick, approximately ten to fifteen mils. The increased thickness decreases the chance of wafer breakage during handling. Also, all bottom side processing is completed prior to the bonding process. Once the electrostatic bonding procedure is complete, the top side of the wafer may then be ground and polished to whatever thickness is desired. An important advantage is that the resulting thickness can now be determined by performance criteria rather than by mechanical handling restraints. Finally, the wafer may then be processed on the front side using such high-temperature techniques as mirror deposition or gate oxidation. The electrostatic bonding technique permits higher temperature processing than those bonding techniques involving adhesives because adhesives may soften at higher temperatures. In addition, in bonding techniques which involve the application of adhesives, the layer of adhesive may distort the resulting image in a device such as a liquid crystal light valve. Also, because the technique need not involve the application of pressure or direct contact with the top surface, there will be less likelihood of damage to a wafer from such mechanical handling or non-uniform, defect-producing pressure.

In a second embodiment of the present invention, a technique called contact bonding is utilized to produce optically flat processed semiconductor wafers. Like electrostatic bonding, contact bonding does not use pressure or adhesives. Another advantage of contact bonding is that the two surfaces bonded by contact bonding may be separated. This permits the use of contact bonding during an intermediate step in the production of optically flat silicon wafers.

In accordance with the second embodiment of the present invention, a thin semiconductor wafer in an unprocessed state is provided with a smooth surface finish, free of orange peel or artifacts. An optically flat carrier substrate, also with a smooth surface finish, is provided. The top surface of the carrier substrate and the bottom surface of the semiconductor wafer are then cleaned so that there are no particles on the surfaces. These two surfaces are then brought together with very light pressure until spontaneous contact bonding occurs. The two surfaces, in effect, are attracted to each other by surface molecular forces. The result is a relatively strong bond with no air gap between the two surfaces. Once the wafer is contact bonded to the substrate, it may then be polished and ground to the required thickness and flatness.

Next, the wafer may be removed from the substrate by simply peeling it off. The loose wafer can then be processed by using a variety of techniques, including high-temperature processes such as mirror deposition, boron diffusion, drive-in temperature cycling, etc. Then, the wafer may be contact bonded to the final substrate. The flexible semiconductor wafer will now stick to the substrate and will conform to that substrate and will also maintain the top surface which was achieved when it was polished while bonded to the first substrate. Thus, if the wafer was originally polished to a one quarter wavelength finish while bonded to the first substrate, it will have a quarter wavelength finish when bonded to the final substrate. At any stage in the above processes, the wafer may have critical photolithography done after contact bonding the wafer again to a flat substrate.

The result is an optically flat, thin semiconductor wafer which is bonded to a substrate without the use of an adhesive, and without the application of extreme temperatures or pressures. The contact bond is strong enough to be used as a permanent bond in a final optical device, such as a liquid crystal light valve. A further advantage is that the semiconductor wafer may be removed from the substrate in the device at a later time for eventual re-use or repair.

In a third embodiment of the present invention, after the wafer is fully processed as in the second embodiment, but before the final contact bonding step, one face of the wafer which has been coated with oxide is contact bonded to a suitably finished carrier baseplate. This may be an optical flat baseplate. The unattached face of the wafer is then bonded to the final substrate with an optically clear adhesive. The carrier baseplate is then removed from the wafer, and a surface such as a mirror is applied to the wafer. While there may be some loss of resolution due to the input light spreading in the adhesive and also due to imprecise focusing through the adhesive when the adhesive thickness is not uniform, there are some applications wherein the resolution requirements are not stringent and can be adequately met with an adhesive bond. The loss of resolution has to be balanced with the advantages of this embodiment. For example, in the second embodiment, where contact bonding is employed in a liquid crystal light valve, the wafer thickness will dictate the uniformity of the liquid crystal layer. However, this limitation is overcome in the third embodiment by the adhesive layer which can compensate for variations in wafer thickness.

DESCRIPTION OF THE PREFERRED EMBODIMENTS

Figure 1:
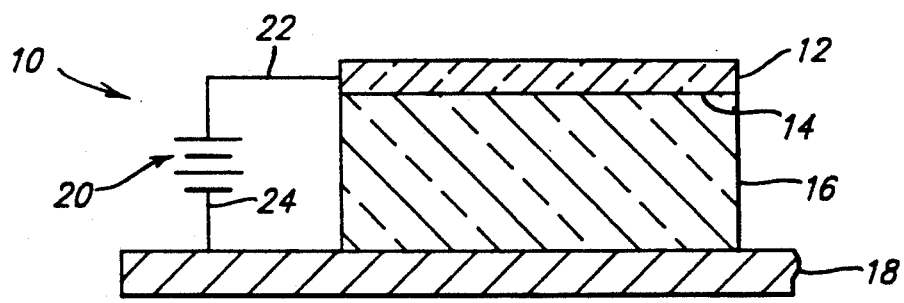
FIG. 1 is a cross-sectional view of an apparatus for electrostatically bonding a silicon wafer to a glass substrate in accordance with the first embodiment of the present invention.

Referring now to the drawings in more detail, FIG. 1 is a cross-sectional view of an apparatus 10 for electrostatically bonding a wafer of semiconductor material, such as silicon, to a glass substrate and producing an optically flat surface on the wafer. In accordance with the first embodiment of the present invention, a wafer 12 of silicon or other suitable material in a relatively thick state is processed on its bottom side 14 only. For example, a silicon wafer 12 with a thickness of 10 mils or greater can be used. Because of the thickness of the wafer 12, there is a reduced likelihood of the wafer 12 being broken during handling. Prior to processing, the wafer 12 is optically polished on the bottom side 14. A glass substrate 16 is provided. The glass substrate is composed of a glass which has a coefficient of thermal expansion as close as possible to that of the wafer 12 over the temperature range to which the wafer 12 and glass 16 combination will be exposed. For example, when the wafer 12 is made of silicon, a suitable glass would be Corning Code 1729. Conventional thermal oxide processing is preferably avoided because such processing typically requires temperatures of 900°–1000° C. for reasonable growth rates, and at these temperatures, the wafer can easily become distorted. "Distortion" is used herein to denote lack of optical flatness. For typical optical processing applications, a high degree of flatness is typically required. As discussed later, surface flatness requirements vary and can be as stringent as one tenth of a wavelength ($\lambda/10$). The highest temperature employed is typically for the anneal step for implant activation. Annealing temperatures are generally about 600° C. to 700° C., depending on the level of activation required. If PECVD or anodic oxide processing is used instead of conventional thermal oxide processing, lower oxide processing temperatures on the order of 450° C. will be typically used.

In any event, the substrate and wafer must have good coefficient of thermal expansion matching, not only at room temperature and temperatures encountered during the bonding process, but also at least up to the highest processing temperatures. Corning glass, Code 1729, is mentioned here only as an example. In practice, other suitable materials which meet the coefficient matching criteria may be used. Further, for optical processing applications, in, for example, a LCLV, the substrate has to be transparent and therefore, glass is identified here as an example.

The glass substrate 16 has a thickness which is chosen on the basis of the overall rigidity requirements for the finished product. In the case of a liquid crystal light valve, this thickness may be about 100 mils. A further consideration in choosing the glass is that the melting point must be high enough to permit later high-temperature processing steps. For example, these later processing steps may include processing at temperatures up to 700° C. The melting point of Corning Code 1729 glass is sufficiently higher than 700° C. to permit such processing. It has been found that a flatness of one half wavelength can be maintained with processing up to 700° C. Limiting the processing to 600° C. will result in flatness from one quarter to one tenth wavelength depending on the initial polishing.

Before placing the wafer 12 on the glass substrate 16, it may be desirable to deposit a layer of $SiO_2$ on the wafer bottom surface 14. This is because electrostatic bonding depends on bonding of oxygen atoms. Thus, because the glass is essentially $SiO_2$, a better bond will result between two $SiO_2$ surfaces. It is possible, however, to electrostatically bond the silicon wafer 12 to the glass substrate 16 without first coating the wafer bottom surface 14 with $SiO_2$. This is because even after cleaning, the silicon wafer 12 will almost immediately form a very thin native oxide layer which provides the oxygen atoms necessary to bond to the glass substrate 16. Nevertheless, it is preferable to use the silicon oxide layer to produce a better bond.

In some applications, an additional coating of a nitride barrier layer may be necessary. This is because the electrostatic bonding process will cause sodium atoms in the glass substrate 16 to migrate through to the silicon. The migrating sodium atoms can drastically alter the conductivity of the silicon. Therefore, in applications such as in integrated circuits where such alteration of the conductivity of the silicon has to be avoided, a barrier layer may be used to prevent sodium atoms from entering the silicon wafer 16. In liquid crystal light valves, the conductive requirements of the silicon layer are less stringent and the barrier layer may not be necessary. Thus, the nitride barrier may be employed if needed for a particular application. The nitride barrier layer may be applied to either the wafer 12 or the glass substrate 16. It has been found that it is more conveniently applied to the wafer 12.

A further consideration when using the nitride barrier layer is that this layer cannot be electrostatically bonded to another surface. For electrostatic bonding, it must be coated with an oxide layer such as $SiO_2$. This is because the nitride layer is very dense and will not permit the transfer of oxygen atoms necessary for electrostatic bonding.

Once the required layers are applied, the wafer 12 may then be placed on top of the glass substrate 16. No pressure is required. The glass substrate 16 is then placed on a plate 18 made of metal or other electrically conductive material. Heat is then applied to the wafer 12, the glass 16 and the plate 18 until the temperature stabilizes near the annealing point of the glass 16. This may be about 500° to 600° C. The positive terminal of a DC voltage source 20 is then connected by means of conductor 22 to the wafer 12, and the negative terminal is attached by means of conductor 24 to the metal plate 18. A voltage roughly with a magnitude in the range of 600–1200 volts, and preferably about 1000 volts is applied. The preferred voltage magnitude will depend on factors such as the type of glass used, the resistance of the contacts, and bonding temperature. While holding the voltage constant, it will be observed that the current level will drop and then begin to stabilize in about 15 minutes. This current drop is evidence of the ion exchange between the two surfaces. After about 15 minutes, the voltage source may be removed and the wafer 12 and glass substrate 16 allowed to cool.

The bond thus created between the wafer and the glass substrate 16 is very strong and is permanent. In tests, it has been found that the glass substrate 16 will fracture before the wafer 12 separates from it. Because of the strength of this bond, the wafer 12 can now be polished down to a very small thickness, such as 30 microns or smaller. The force generated during polishing will not destroy the bond. This is desirable in devices such as a liquid crystal light valve because resolution can be improved by using thinner silicon wafers. A thickness on the order of 30 microns will optimize resolution without sacrificing contrast. However, various thicknesses can be used, depending on specific performance requirements.

In polishing the wafer 12 to achieve the desired thickness, the wafer 12 can also be polished to the desired flatness. Using the above techniques, a surface flatness of one tenth wavelength, measured with light of a wavelength of 0.632 microns, has been achieved over most of the active area of the silicon wafer 12. For example, this area extends to within 0.15 inches of the wafer edge. As used in the present application, the measure of optical flatness is in relationship to measurements made with a He-Ne laser having a wavelength of 0.632 microns.

The top surface of the wafer 12 may now be processed in any manner desired. This may include the use of high-temperature processes up to 700° C. Depending on the device, this processing may include, for example, guard ring, microdiodes, gate oxide or mirror deposition. One advantage of this embodiment is that the wafer is not handled in a thin state but instead all processing steps are accomplished either when the wafer is thick, before bonding, or while attached to the glass substrate 16. Thus, the likelihood of breaking the wafer 12 is greatly reduced. During handling of thin wafers, for example, 5 mils thick, due to breakage, typical yields are on the order of 30-40%. However, with wafers electrostatically bonded to a thick glass support, yields as high as 90% and greater can be achieved. Another advantage is that the final thickness is not restricted by the ability to handle the thin wafer 12. Also, since no adhesive is used, the wafer can be processed at extremely high temperatures. If an adhesive is used, processing at high temperatures could result in problems due to softening of the adhesive. Further, there is no layer of adhesive to affect the resulting optical quality. By means of the method of the present invention, it has been found that electrostatic bonding may be successfully employed to produce silicon wafers with superior optical characteristics, specifically optical flatness. Optical flatness is important because it directly determines the uniformity of an optical image. In liquid crystal light valves it has been found that the above electrostatic bonding technique has permitted either an increased aperture size or a decrease in thickness to improve resolution.

While the electrostatic bond in the above embodiment is virtually indestructible, in some cases it is desirable to be able to remove the wafer once it is attached. Thus, in accordance with the second embodiment of the present invention, there is a method for providing an optically flat silicon wafer which employs a bonding technique that permits the wafer to be easily removed. This technique is called contact bonding. Referring now to FIG. 2a there is shown an unprocessed silicon wafer 26 which may have, for example, a thickness of 0.010 inches. A carrier substrate 28 is also shown which is composed of a glass which preferably has a coefficient of thermal expansion which is matched to that of the silicon wafer 26. The top surface 30 of the carrier substrate 28 is polished to be optically flat, for example, to within one quarter wavelength. It is important that both the top surface of the carrier substrate 30 and the bottom of the wafer 26 have good surface finishes free of orange peel or artifacts.

The top surface 30 of the glass substrate 28 and the bottom surface of the wafer 26 are cleaned so that they are free of particles. To achieve the desired degree of cleanliness, cleaning should be done in a clean room atmosphere. The wafer 26 is then brought into contact with the carrier substrate 28. Once contact is made at a single point, molecular forces of attraction will cause the two surfaces to attach without any air gaps between them. The result is shown in FIG. 2b. While the bottom surface of the wafer 26 will conform to the flat top surface 30 of the carrier substrate 28, it can be seen that the top surface 32 of the wafer 26 is not smooth but instead is wavy. This is because the silicon wafer is thin and flexible and non-uniform in thickness and conforms to the top surface 30 of the carrier substrate 28.

The wafer 26 is then polished in a conventional manner to the desired thickness and optical flatness. For example, the wafer 26 may be polished until a thickness of 0.005 inches and a flatness of one quarter wavelength is achieved. The polishing must be performed carefully to ensure that forces on the wafer 26 do not break the bond between it and the carrier substrate 28. The wafer 26 and carrier substrate 28 are shown after polishing in FIG. 2. It can be seen that the top surface 32 is now flat.

The wafer 26 is now ready for processing. Some processing steps may be performed while the wafer is still attached to the substrate 28. For example, precise photolithography may be successfully performed. Since the top surface 32 of the wafer 26 is optically flat, photolithography employing geometries below 3 microns, for example, may be successfully performed. Yields should be relatively high when compared with conventional methods of holding thin wafers during photolithography, for example the vacuum chuck method. This is because vacuum chucks distort the surface of a thin wafer and cause the photomask image to be distorted.

Figure 4:
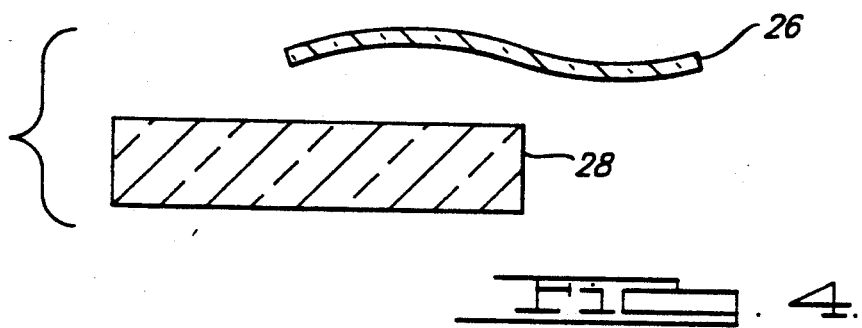
FIG. 4 is a cross-sectional view of the silicon wafer after it has been removed from the carrier substrate for further processing in accordance with the second embodiment.

As shown in FIG. 4, the wafer 26 may next be removed from the carrier substrate 28 by simply peeling off the wafer 26. The wafer 26 may then have various processing steps performed. These may include, for example, mirror deposition, boron diffusion and drive-in temperature cycling. These processing steps may be employed at temperatures as high as 1,000° C. without damaging the wafer 26. It is notable that since the wafer 26 is unbonded, higher processing temperatures are permissible than would be possible if the wafer were bonded with conventional techniques or with the techniques employed in the first embodiment of this invention.

Figure 2:
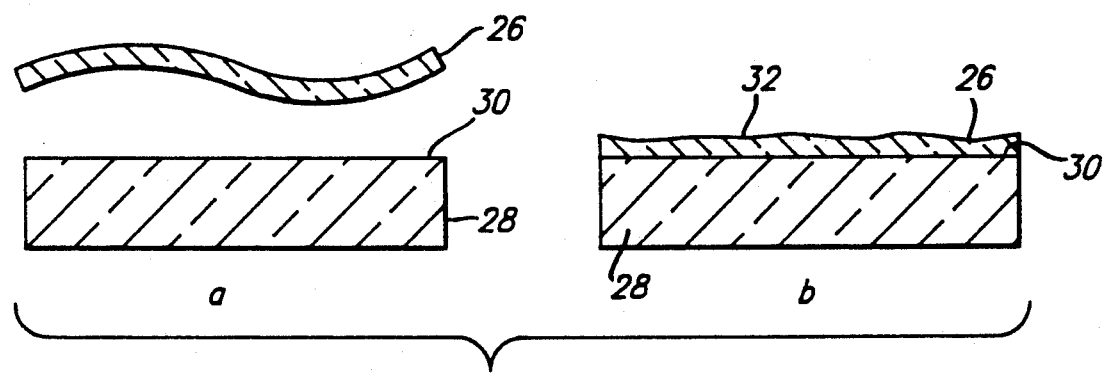
FIG. 2 is a cross-sectional view of a second embodiment of the present invention showing a silicon wafer and a glass substrate before and after the wafer is contact bonded to the carrier substrate.
Figure 3:
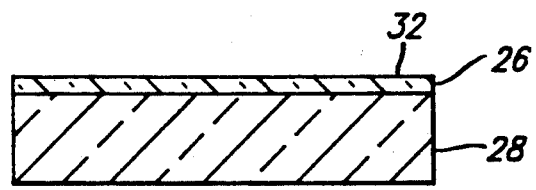
FIG. 3 is a cross-sectional view of the silicon wafer bonded to the carrier substrate after the top surface of the wafer has been ground and polished in accordance with the second embodiment.
Figure 5:
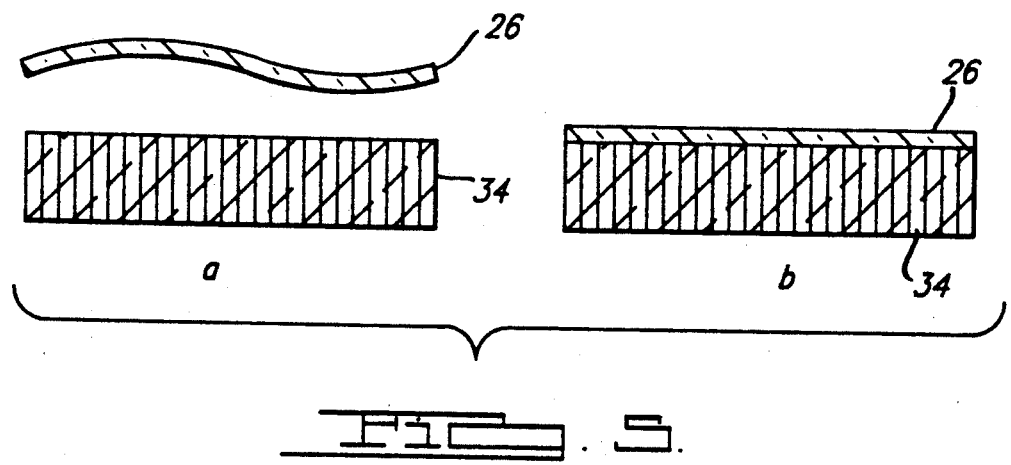
FIG. 5 is a cross-sectional view of the silicon wafer and the final substrate before and after they have been contact bonded together in accordance with the second embodiment.

Referring now to FIG. 5a, once all the processing steps are complete, the wafer 26 may be cleaned and attached to the final substrate 34 by the same contact bonding technique as discussed in connection with FIG. 2. The final substrate 34 must have a good surface finish, must be free of particles and may consist of the original carrier substrate 28 or another optically flat or other suitable substrate, such as a fiber optic face plate. If the final substrate 34 is a fiber optic faceplate, it is preferable to have the surface of the fiber optic faceplate planarized. A planarization technique for fiber optic faceplates is described in a commonly assigned patent application entitled "Planarization of Fiber Optic Faceplates" by James W. Hayden, filed concurrently herewith, Ser. No. 201,810. As shown in FIG. 5b, once the wafer 26 is contact bonded to the final substrate 34, the flexible wafer will conform itself to the surface of the final substrate 34. Alternatively, the wafer 26 may be electrostatically bonded to the substrate 34. Because of the prior processing steps, the top surface 32 of the wafer 26 will now conform to the original flat contour that it had after the polishing steps discussed in connection with FIG. 3. Thus, it is an advantage that no further steps are necessary to restore the prior flatness. Also, no contact or pressure is now required to achieve a bond. This is an advantage because the top surface 32 might now have a mirror or other surface which would be distorted or damaged by direct contact or by the application of pressure. Where the wafer is to be used in a liquid crystal light valve, it is important that the thickness of the wafer be very uniform after polishing. This is because the wafer thickness will dictate the uniformity of the liquid crystal layer.

An additional advantage is that no adhesive is used. Use of adhesives can reduce the optical quality and resolution of the final product. The bond thus created between the wafer 26 and the final substrate 34 is strong enough to be used permanently, for example in a liquid crystal light valve. The contact bonding technique has the further advantage of permitting the wafer 26 to be removed at a later time for recycling or repair.

Previously, the phenomena of contact bonding has been used, for example, to attach a rigid optical device, such as a prism, to a larger tool to hold the device during polishing. However, by using the method of the present invention, it has been found that thin, flexible optically flat semiconductor wafers can now be produced. This is because the thin wafer conforms to the substrate surface when contact bonded to it, and after polishing and removal, it conforms to the original polished surface when re-contact bonded to a substrate.

Figure 6A:
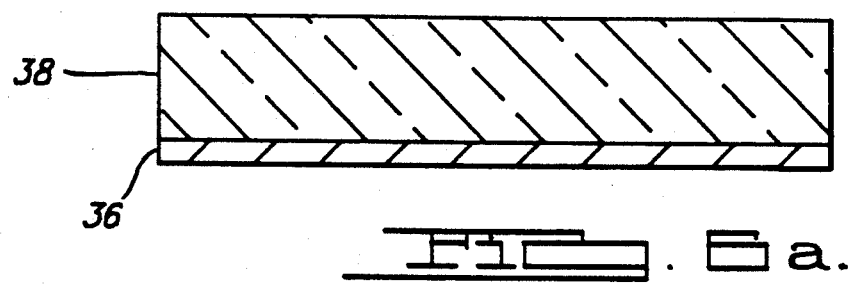
FIGS. 6a–6c are a cross-sectional view of a silicon wafer contact bonded to a carrier and bonded with an adhesive to a baseplate in accordance with the third embodiment of the present invention.
Figure 6B:
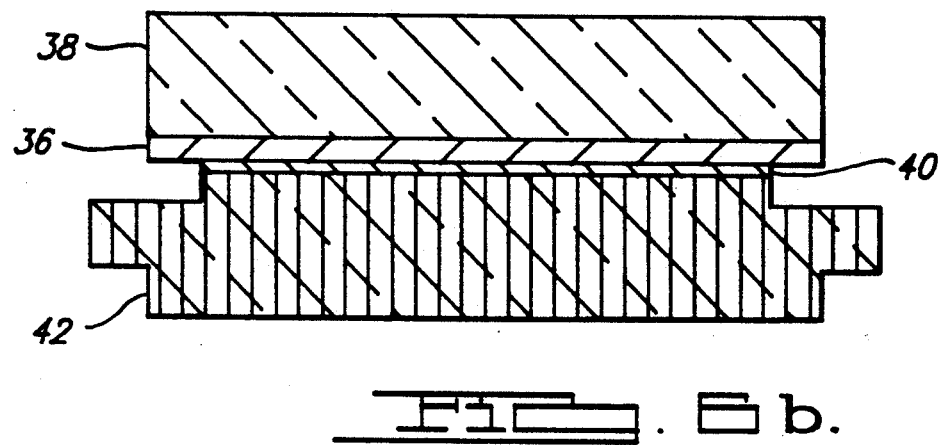
Figure 6C:
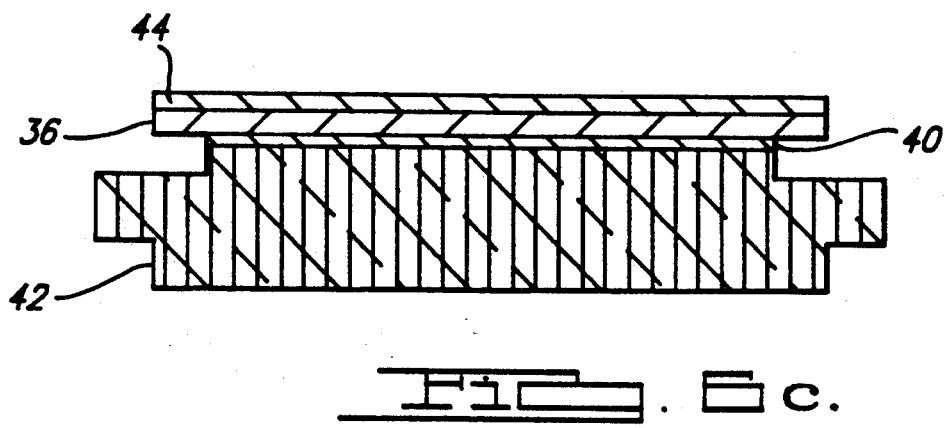

Referring now to FIGS. 6A through 6C, a third embodiment of the present invention is shown. This embodiment incorporates contact bonding as in the second embodiment, but also utilizes an adhesive for the final bond. In FIG. 6A, a thin semiconductor wafer 36 is shown after it has been fully processed. These processes may include traditional processing methods, including high-temperature thermal oxide. The oxide coated face of the processed wafer 36 is then contact bonded to a suitably finished carrier baseplate 38. This baseplate 38 is preferably an optical flat. Referring now to FIG. 6B, the unattached face of the wafer 36 is then bonded using a layer of adhesive 40 to a final substrate 42. The adhesive 40 may comprise an optically clear adhesive such as certain epoxies. The final substrate 42 may be a glass baseplate or a fiber optic faceplate. Once the adhesive layer 40 is fully cured, the carrier baseplate 38 may be removed. Removal is best accomplished by applying slow, steadily increasing pressure with a fixture, to avoid tangential slippage that might damage the wafer surface. To further prevent damage, a very thin layer of photoresist or other suitable material may be first applied to the wafer 36 by spinning or other means to ensure uniformity. Once the carrier baseplate 38 is removed from the wafer 36, a dielectric mirror surface 44 may be applied to the wafer 36. The mirror surface 44 must be applied using a deposition temperature which remains below the distortion temperature of the adhesive. It has been found that temperatures of 200° C. are suitable for the epoxies used, and a flatness of one quarter wavelength has been maintained using these temperatures. One advantage of this embodiment is that when a fiber optic faceplate is used for the final substrate 42 it does not have to be planarized before an adequate bond can be achieved. Further, this technique overcomes one limitation of contact bonding, namely, that the thickness of the wafer has to be very uniform after polishing. This is because the wafer will dictate the uniformity of the liquid crystal layer when the wafer is used in a liquid crystal light valve. Wafer uniformity is not as critical in the third embodiment because the adhesive layer 40 compensates for differences in wafer thickness.

Other variations of the above embodiments may be successfully employed depending on the final device to be produced. For example, where a stronger final bond is required, the final step of bonding in the second embodiment may employ electrostatic bonding instead of contact bonding. In addition, the wafer 26 shown in FIG. 5 may be flipped over before final bonding to produce the desired finish and processing steps on both sides of the wafer 26. Also, it may be desired to produce a device having a silicon wafer with a curved rather than a flat contour. In this case, all of the above embodiments may be successfully employed to produce a curved surface with surface contours that are very uniform to within, for example, one quarter wavelength. Those skilled in the art will come to appreciate that other advantages and modifications of the particular examples set forth herein are attainable without departing from the spirit of the invention as defined in the following claims:

What is claimed is:

1. A method of producing a device having an optically flat thin silicon wafer bonded to a glass substrate having a coefficient of thermal expansion which is matched to that of the silicon wafer, said method comprising:

coating the silicon wafer on its bottom surface with $SiO_2$;

bringing the bottom surface of the silicon wafer into intimate contact with the substrate;

heating the silicon wafer and the substrate to a temperature which is near the annealing point of the glass substrate;

applying a direct current voltage of about 1,000 volts across the wafer and the substrate until the current thereby produced lowers and stabilizes, whereby an electrostatic field assisted thermal bond is created between the wafer and the substrate; and polishing the silicon wafer to achieve optical flatness.

2. The method of claim 1 further including the step of coating the bottom surface of the silicon wafer with a nitride barrier layer before the step of coating with $SiO_2$.

* * * * *